United States Patent
Tong et al.

(10) Patent No.: US 10,641,850 B2
(45) Date of Patent: May 5, 2020

(54) MAGNETIC RESONANCE SIGNAL RECEIVING APPARATUS, RECEPTION COIL CHANNEL SELECTOR AND MAGNETIC RESONANCE IMAGING SYSTEM

(71) Applicant: Siemens Healthcare GmbH, Erlangen (DE)

(72) Inventors: Tong Tong, Shenzhen (CN); JianMin Wang, Shenzhen (CN); Zhi Bin Li, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 205 days.

(21) Appl. No.: 15/696,382

(22) Filed: Sep. 6, 2017

(65) Prior Publication Data

US 2018/0067180 A1 Mar. 8, 2018

(30) Foreign Application Priority Data

Sep. 6, 2016 (CN) .......................... 2016 1 0811577

(51) Int. Cl.
*G01R 33/36* (2006.01)
*G01R 33/3415* (2006.01)

(52) U.S. Cl.
CPC ..... *G01R 33/3642* (2013.01); *G01R 33/3415* (2013.01); *G01R 33/3614* (2013.01); *G01R 33/3664* (2013.01); *G01R 33/3621* (2013.01)

(58) Field of Classification Search
CPC ............ G01R 33/3642; G01R 33/3614; G01R 33/3621; G01R 33/3415; G01R 33/3664
See application file for complete search history.

(56) References Cited

U.S. PATENT DOCUMENTS

| 4,825,162 A | * | 4/1989 | Roemer | ............. | G01R 33/3415 |
| | | | | | 324/312 |
| 5,160,891 A | * | 11/1992 | Keren | ................ | G01R 33/3415 |
| | | | | | 324/318 |

(Continued)

FOREIGN PATENT DOCUMENTS

| CN | 101806873 A | 8/2010 |
| CN | 203025333 U | 6/2013 |
| CN | 203444094 U | 2/2014 |

OTHER PUBLICATIONS

Chinese action dated Jul. 18, 2019, for application No. 201610811577.X.

*Primary Examiner* — Dixomara Vargas
(74) *Attorney, Agent, or Firm* — Schiff Hardin LLP

(57) ABSTRACT

A magnetic resonance (MR) signal receiving apparatus has multiple local coils, capable of separately receiving MR signals generated by a body in an MR examination, each of the local coils having multiple antenna units and a time division multiplexing module. The time division multiplexing module enables MR signals received by the antenna units separately to be provided as an output by just one output line. The apparatus also has a reception coil channel selector having multiple input interfaces connected to the respective output lines of the multiple local coils, and a combiner in the reception coil channel selector that combines in time or power, all or a portion of the MR signals of the local coils, to form one or more MR composite signals.

10 Claims, 7 Drawing Sheets

(56) References Cited

U.S. PATENT DOCUMENTS

| | | | | |
|---|---|---|---|---|
| 5,258,717 A | * | 11/1993 | Misic | G01R 33/3415 324/318 |
| 5,272,437 A | * | 12/1993 | Wardenier | G01R 33/3415 324/318 |
| 5,374,890 A | * | 12/1994 | Zou | G01R 33/3415 324/309 |
| 5,510,714 A | * | 4/1996 | Takahashi | G01R 33/34046 324/318 |
| 6,150,816 A | * | 11/2000 | Srinivasan | G01R 33/3415 324/318 |
| 6,591,128 B1 | * | 7/2003 | Wu | G01R 33/34084 324/318 |
| 6,850,064 B1 | * | 2/2005 | Srinivasan | G01R 33/34046 324/318 |
| 6,914,432 B2 | * | 7/2005 | Dumoulin | G01R 33/3415 324/318 |
| 7,098,659 B2 | * | 8/2006 | Reykowski | G01R 33/54 324/309 |
| 7,157,910 B2 | * | 1/2007 | Van Den Brink | G01R 33/3621 324/309 |
| 7,183,770 B2 | * | 2/2007 | Graβlin | G01R 33/3415 324/318 |
| 7,394,253 B2 | * | 7/2008 | Okamoto | G01R 33/3415 324/318 |
| 7,834,628 B2 | | 11/2010 | Biber et al. | |
| 8,055,196 B2 | | 11/2011 | Biber et al. | |
| 8,269,493 B2 | * | 9/2012 | Demharter | G01R 33/341 324/307 |
| 8,390,292 B2 | * | 3/2013 | Bollenbeck | G01R 33/341 324/318 |
| 8,487,622 B2 | * | 7/2013 | Biber | G01R 33/3692 324/318 |
| 8,547,098 B2 | * | 10/2013 | Biber | G01R 33/3685 324/307 |
| 8,581,588 B2 | * | 11/2013 | Driesel | G01R 33/3415 324/307 |
| 8,866,482 B2 | | 10/2014 | Bollenbeck et al. | |
| 9,261,573 B1 | * | 2/2016 | Radparvar | G01R 33/323 |
| 9,513,350 B2 | * | 12/2016 | Li | G01R 33/34092 |
| 9,612,304 B2 | * | 4/2017 | Biber | G01R 33/3415 |
| 9,817,098 B2 | * | 11/2017 | Campagna | G01R 33/36 |
| 2018/0067180 A1 | * | 3/2018 | Tong | G01R 33/3642 |

* cited by examiner

MAGNETIC RESONANCE SIGNAL RECEIVING APPARATUS, RECEPTION COIL CHANNEL SELECTOR AND MAGNETIC RESONANCE IMAGING SYSTEM

BACKGROUND OF THE INVENTION

Field of the Invention

The present invention relates to a magnetic resonance (MR) signal receiving apparatus, a reception coil channel selector, and a magnetic resonance imaging (MRI) system.

Description of the Prior Art

At present, in order to acquire a full-body (MR) image, a total imaging matrix (TIM) has the largest coverage, the highest signal-to-noise ratio and the highest speed. Multiple antenna unit coils must be used in a TIM. During a scan, a user generally connects to the system the coils which he or she needs to simultaneously use, and selects from the coils a specific combination of a portion of the antenna units for a specific region under examination, and so does not need to change coils and reposition the patient during the scan. Thus, it is necessary to be able to connect a specific antenna unit within a desired coil to a radio frequency (RF) receiver arbitrarily.

FIG. 6 shows as an example a magnetic resonance signal reception link of an existing local coil. In FIG. 6, one local coil 40 has M antenna units (coil elements) 41, each antenna unit 41 having its own amplifier 42 and its own cable. Thus, M cables must be configured for each local coil 40; the volume and quantity of cables are high, and apart from being expensive to manufacture, the cables are not very comfortable. In addition, magnetic resonance signals from the antenna units 41 pass through a reception coil channel selector (RCCS) 50 and enter an RF receiver 60. The RCCS 50 is a switch array with L*M input terminals and N output terminals. Specifically, magnetic resonance signals of L*M antenna units 41 are switched to N output channels via the RCCS 50. In turn, the N output channels of the RCCS 50 are connected to N receiving channels of the RF receiver 60. In addition, the RF receiver 60 comprises an amplifier 61, a compressor 62, an analog-to-digital converter (ADC) 63 and a digital processor 64.

Hence, in the existing technical solution described above, M cables must be provided for each local coil, and each receiver 60 must further be provided with N receiving channels, so the costs of the cables and receiver are high. Moreover, in such an existing magnetic resonance signal receiving link, wastage of output channels of the RCCS 50 or receiving channels of the RF receiver 60 will sometimes result. In particular, when an MRI apparatus has multiple local coils, the increase in these costs is more obvious.

SUMMARY OF THE INVENTION

An object of the present invention is to provide a magnetic resonance signal receiving apparatus, a reception coil channel selector and a magnetic resonance imaging system, which are capable of performing magnetic resonance imaging using multiple local coils with a simple structure at a low cost.

In an embodiment of the present invention, a magnetic resonance signal receiving apparatus has multiple local coils, capable of separately receiving magnetic resonance signals generated when a body under examination undergoes magnetic resonance examination, each of the local coils including multiple antenna units and a time division multiplexing module. The time division multiplexing module enables magnetic resonance signals received by the antenna units separately to be emitted by just one output line. The apparatus also has a reception coil channel selector, having multiple input interfaces, with the input interfaces being connected to the respective output lines of the multiple local coils in a corresponding fashion. The apparatus also has a combiner in the reception coil channel selector, which combines in time or power all or a portion of magnetic resonance signals emitted by the output lines of the local coils, so as to form one or more magnetic resonance composite signals.

In addition, in the magnetic resonance signal receiving apparatus, the local coil preferably also has an amplifier and a bandpass filter connected in series with each of the antenna units respectively, and provides magnetic resonance signals that have been processed by the amplifier and bandpass filter to the time division multiplexing module.

In addition, in the magnetic resonance signal receiving apparatus, the combiner is preferably either a power combiner or a time division multiplexing module.

In addition, in the magnetic resonance signal receiving apparatus, the power combiner preferably has multiple amplification resistance circuits connected in parallel, each amplification resistance circuit has a second amplifier and a first resistor, and the multiple amplification resistance circuits connected in parallel being further connected in series with a second resistor.

In addition, the magnetic resonance signal receiving apparatus preferably also has an RF receiver having one or more RF receiving channels connected to an output interface of the reception coil channel selector, and the magnetic resonance composite signal formed through combination by the combiner is provided to the RF receiver via the RF receiving channel.

In addition, in the magnetic resonance signal receiving apparatus, a switch array is also preferably provided in the reception coil channel selector, the switch array being capable of selectively passing a portion of magnetic resonance signals provided from the output lines of the local coils, and providing the magnetic resonance signals, which have passed through the switch array, as inputs to the combiner.

In addition, in the aforementioned magnetic resonance signal receiving apparatus, the time division multiplexing module preferably also has a programmable logic device used to control a timeslot for the output of a magnetic resonance signal by a specific one of multiple antenna units.

In addition, in the aforementioned magnetic resonance signal receiving apparatus, the reception coil channel selector is preferably provided with multiple combiners, and magnetic resonance signals selected by the switch array are divided into groups, and inputted according to group to the corresponding combiners.

In addition, in the magnetic resonance signal receiving apparatus, the number of RF receiving channels in the RF receiver is preferably the same as the number of magnetic resonance composite signals formed through combination by the combiner.

Another embodiment of the present invention provides a reception coil channel selector, which is used for receiving magnetic resonance signals from multiple local coils and only receives a magnetic resonance signal from one of the local coils at one time, and the reception coil channel selector has a combiner that combines in time or power all or a portion of magnetic resonance signals provided by the local coils, so as to form one or more magnetic resonance composite signals.

Another embodiment of the present invention provides a magnetic resonance imaging apparatus, which includes the magnetic resonance signal receiving apparatus described above.

In the magnetic resonance signal receiving apparatus of the present invention, by providing a time division multiplexing module in the local coil equipped with multiple antenna units, it is possible to select just one antenna unit to output a magnetic resonance signal within a particular timeslot, so there is no need to configure a separate cable for each antenna unit in a corresponding fashion; thus the volume and number of local coil cables used is reduced, and costs are lowered. In turn, by providing the power combiner in the reception coil channel selector, the number of output cables used for outputting signals from the reception coil channel selector can furthermore be reduced, hence the number of RF receiving channels of the RF receiver can be correspondingly reduced, to make costs lower.

DESCRIPTION OF THE PREFERRED EMBODIMENTS

Figure 1A:
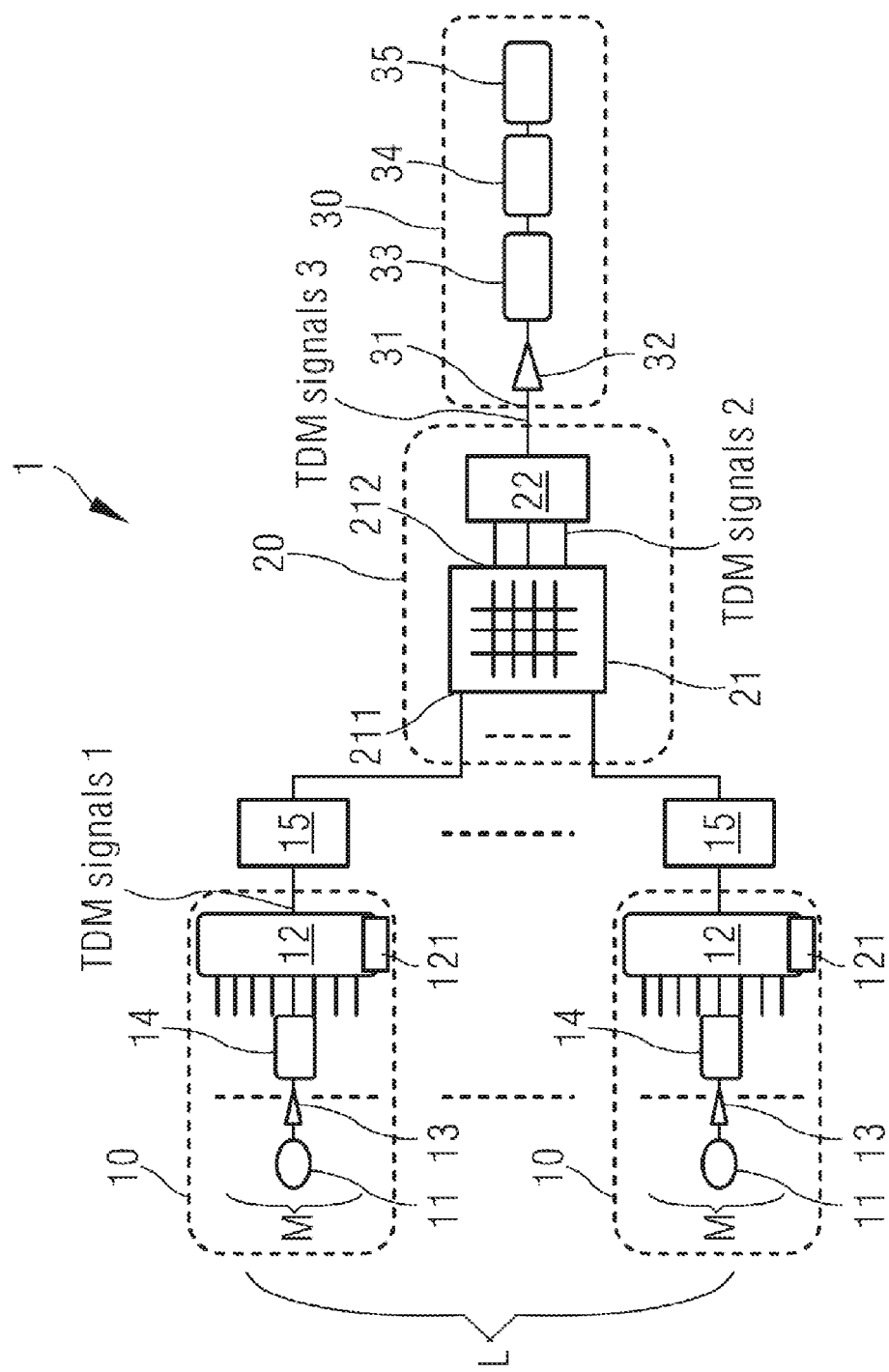
FIG. 1A is a schematic structural diagram of the magnetic resonance signal receiving apparatus in a first embodiment of the present invention.

As used herein, "schematic" means "serving as an instance, example or illustration". No drawing or embodiment described herein as "schematic" should be interpreted as a more preferred or more advantageous technical solution.

To make the drawings uncluttered, only those parts relevant to the present invention are shown schematically in the drawings; they do not represent the actual structure thereof as a product. Furthermore, to make the drawings appear uncluttered for ease of understanding, in the case of components having the same structure or function in certain drawings, only one of these is drawn schematically, or only one is marked.

First Embodiment

FIG. 1A shows a magnetic resonance signal receiving apparatus 1 in a first embodiment of the present invention. The apparatus has multiple local coils 10, an RCCS 20 and an RF receiver 30. Here, L local coils 10 are as an example. Using the local coils 10, magnetic resonance signals generated when nuclear spins in a body under examination are excited and subsequently relax, can be separately (per coil) received. Each local coil 10 further has multiple antenna units 11 and a time division multiplexing module 12. For example, each local coil 10 has M antenna units 11. In this embodiment, each antenna unit 11 is further connected to a first amplifier 13 and a surface acoustic wave filter (SAWF) 14. The first amplifier 13 amplifies a (relatively) weak magnetic resonance signal received by the antenna unit 11. The amplified magnetic resonance signal passes through the SAWF 14 to give a filtered signal of a certain bandwidth. The SAWF 14 is an RF signal processing device, principally composed of a piezoelectric substrate, and an input transducer and an output transducer on the substrate. The input transducer converts an input electric signal to a sound signal (inverse piezoelectric effect), the sound signal propagates along a surface of the piezoelectric substrate, and is converted to an electric signal at the output transducer (piezoelectric effect). By selecting an appropriate substrate material and weighting the two transducers, it is possible for signals of different frequencies to have different conversion efficiencies, so as to achieve a frequency selection function (filtering). It should be noted that the case where the SAWF 14 is used to filter amplified magnetic resonance signals is shown here as an example, but the invention is by no means limited to the SAWF; all that is needed is a bandpass filter capable of filtering an amplified magnetic resonance signal to obtain a signal with a certain bandwidth appropriate for the time division multiplexing module 12.

Next, the magnetic resonance signal processed by the first amplifier 13 and the SAWF 14 is provided as an input to the time division multiplexing (TDM) module 12. The TDM 12 uses different time periods of the same physical connection to transmit different signals, to achieve the objective of multiplexing. Time division multiplexing uses time as a parameter for signal division, such that different signals do not overlap with each other on the time axis. The time division multiplexing module 12 divides the information transmission time provided for the entire channel into a number of time segments (timeslots), and allocates these timeslots to each signal source for use. Thus, using the time division multiplexing module 12, magnetic resonance signals TDM Signal1 received by the multiple antenna units respectively can be emitted as an output on only one output line; here, the magnetic resonance signal TDM Signal1 is referred to as a first signal. In addition, it should be noted that the time division multiplexing module 12 also has a complex programmable logic device 121 (CPLD); using the CPLD 121, it is possible to select timeslots for use by the needed antenna units 11 according to control requirements of the MRI apparatus. It should be noted that the CPLD 121 has been shown here as an example, but all that is needed is a programmable logic device capable of controlling the time division multiplexing module 12.

Figure 2:
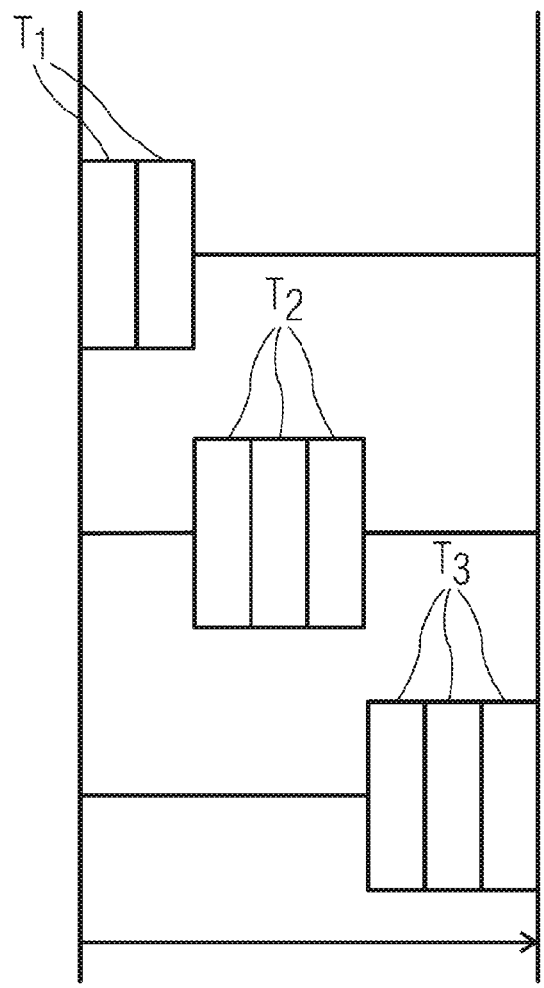
FIG. 2 is a schematic diagram of magnetic resonance signal output control performed by the time division multiplexing module.

FIG. 2 shows, as an example, a schematic diagram of the case where the local coil 10 uses the CPLD 121 to control magnetic resonance signal output. Here, the case where three local coils 10 are provided is explained as an example. As FIG. 2 shows, for the first local coil 10, two timeslots T1 i.e. two antenna units 11 are selected for output, then for the second local coil 10, three timeslots T2 i.e. three antenna units 11 are selected for output, then for the third local coil 10, three timeslots T3 i.e. three antenna units 11 are selected for output.

Returning to FIG. 1A, output lines from the local coils 10 are connected to cables of the RCCS 20 mentioned below via plugs 15 disposed on a patient table, and then connected to an input interface of the RCCS 20. As FIG. 1 shows, in this embodiment, the RCCS 20 comprises an L*3 switch array 21 and a power combiner 22; in other words, first signals that are detected by L local coils 10 and emitted as outputs via the time division multiplexing modules 12 are respectively so as to be provided as inputs to L input terminals 211 of the switch array 21, then three magnetic resonance signals are selected therefrom by the switch array 21 and outputted from three output terminals 212 of the switch array 21; the magnetic resonance signals TDM Signal2 outputted from the three output terminals 212 are referred to as second signals. The second signals are then inputted into the power combiner 22, and the power combiner 22 subjects the three inputted second signals to power combining to form one magnetic resonance composite signal TDM Signal3, which is referred to as a third signal here.

Figure 1B:
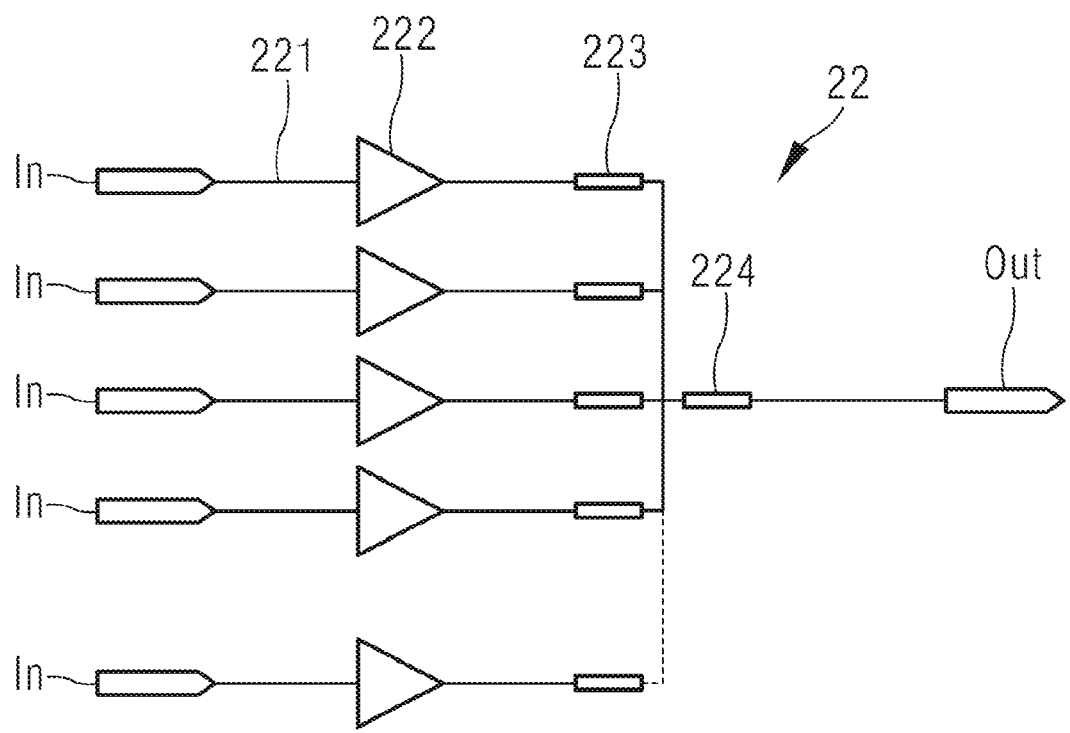
FIG. 1B is a schematic structural diagram of the power combiner in the magnetic resonance signal receiving apparatus of the first embodiment of the present invention.

FIG. 1B shows the structure of the power combiner 22 mentioned above. The power combiner 22 to which this embodiment relates includes multiple amplification resistance circuits 221 connected in parallel, with each amplification resistance circuit 221 having a second amplifier 222 and a first resistor 223. As stated above, there are three second signals provided as inputs to the power combiner 22, so it is only necessary to provide three parallel-connected amplification resistance circuits 221, which are respectively connected to input terminals. The multiple parallel-connected amplification resistance circuits 221 are further connected in series with a second resistor 224. In this embodiment, by providing the second amplifiers 222 and making use of the isolation of the input from the output of each second amplifier 222, decoupling among the multiple magnetic resonance signals as inputs to the power combiner 22 due to the first resistors 223, and signal-to-noise ratio loss caused by the first resistors 223 and the second resistor 224, can be ameliorated.

Since the power combiner 22 is provided in the RCCS 20, only one magnetic resonance composite signal is emitted as an output from the RCCS 20, and correspondingly, an RF receiver 30 need only be equipped with one RF receiving channel 31. By connecting the RF receiving channel 31 of the RF receiver 30 to an output interface of the power combiner 22, the magnetic resonance composite signal (third signal) is provided as an output to the RF receiver 30 from the power combiner 22. The magnetic resonance composite signal provided as an input to the RF receiver 30 is then provided as an input to an analog-to-digital converter 34 via a third amplifier 32 and a compressor 33, and is converted therein to a digital signal, which is then processed by a digital processor 35. Here, the digital processor 35 may be, for example, a field programmable gate array.

In this embodiment, the case where the switch array 21 has three output terminals 212 is shown as an example, but the invention is by no means limited to this; the switch array could also have a different number of output terminals.

In this embodiment, by providing one time division multiplexing module 12 in the local coil 10, it is possible to select just one antenna unit 11 to output a magnetic resonance signal within a particular timeslot, so there is no need to configure a separate cable for each antenna unit in a corresponding fashion; thus the number of local coil cables is reduced, and costs are lowered. In turn, by providing the power combiner 22 in the RCCS 20, the number of output cables used for outputting signals from the RCCS 20 can furthermore be reduced, hence the number of RF receiving channels 31 of the RF receiver 30 can be correspondingly reduced, to make costs lower.

Second Embodiment

Figure 3:
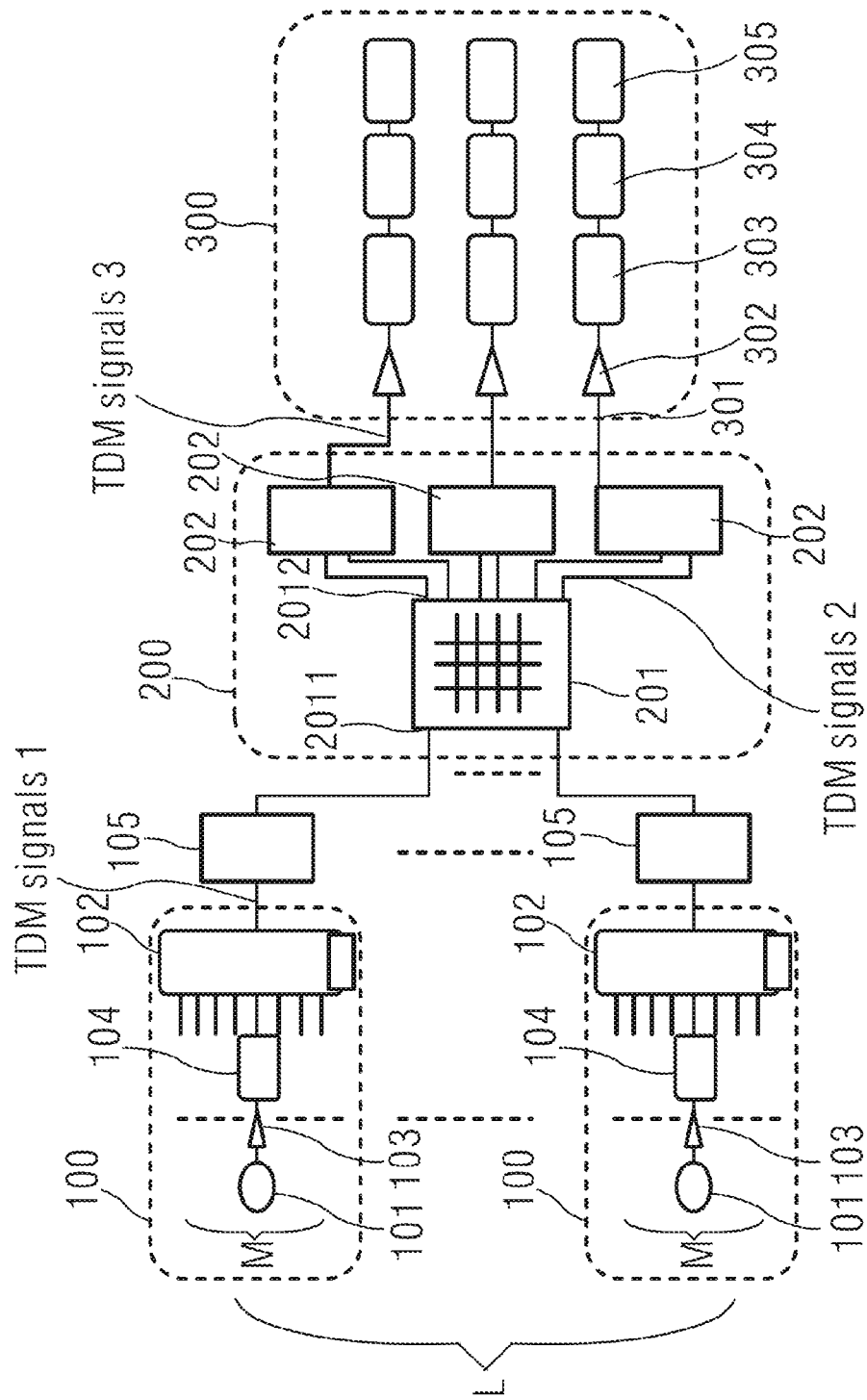
FIG. 3 is a schematic structural diagram of the magnetic resonance signal receiving apparatus in a second embodiment of the present invention.

Reference is made to FIG. 3 below, to explain a second embodiment of the present application.

In this embodiment, the local coil 100 is the same as in the first embodiment; each local coil 100 has multiple antenna units 101 and a time division multiplexing module 102, and each antenna unit 101 is further connected to a first amplifier 103 and a surface acoustic wave filter 104.

The local coil 100 is connected to an RCCS 200 via a plug 105. However, the RCCS 200 comprises an L*6 switch array 201 and multiple power combiners 202 (three power combiners are shown here as an example). A detailed explanation now follows. First signals TDM Signal1, which are detected by L local coils 100 and outputted via the time division multiplexing modules 102, are inputted to L input terminals 2011 of the switch array 201, then six magnetic resonance signals TDM Signal2 (i.e. second signals) are emitted as outputs selectively via the switch array 201, and provided as outputs from six output terminals 2012 of the switch array 201. The six outputted second signals are divided into three groups (each pair of second signals forming one group), which are provided as inputs to the three power combiners 202 respectively, and each power combiner 202 subjects the two second input signals to power combining, so as to form one magnetic resonance composite signal TDM Signal3, i.e. a third signal. The magnetic resonance composite signal emitted as an output from each power combiner 202 is then provided as an input to an RF receiver 300. It should be noted that in this embodiment, the structure of the power combiner 202 is the same as in the first embodiment above.

In this embodiment, the RF receiver 300 has three RF signal receiving channels 301. As in the first embodiment above, each RF signal receiving channel 301 also comprises a third amplifier 302, a compressor 303, an analog-to-digital converter 304 and a digital processor 305.

In the embodiment above, it has been shown as an example that the switch array 201 has six output terminals 2012, but the invention is by no means limited to this; switch arrays with different numbers of output terminals may also be used as required. Furthermore, in this embodiment, the case where six second signals are divided into groups with each pair of signals forming one group has been shown as an example, but the invention is by no means limited to this. The six second signals could also be divided equally into two groups with each trio of second signals forming one group, or divided into two groups with one group comprising four second signals and the other group comprising two second signals, with two power combiners 202 being provided; in such a situation, it is also only necessary for two RF signal receiving channels 301 to be provided in the RF receiver 300.

Third Embodiment

Figure 4:
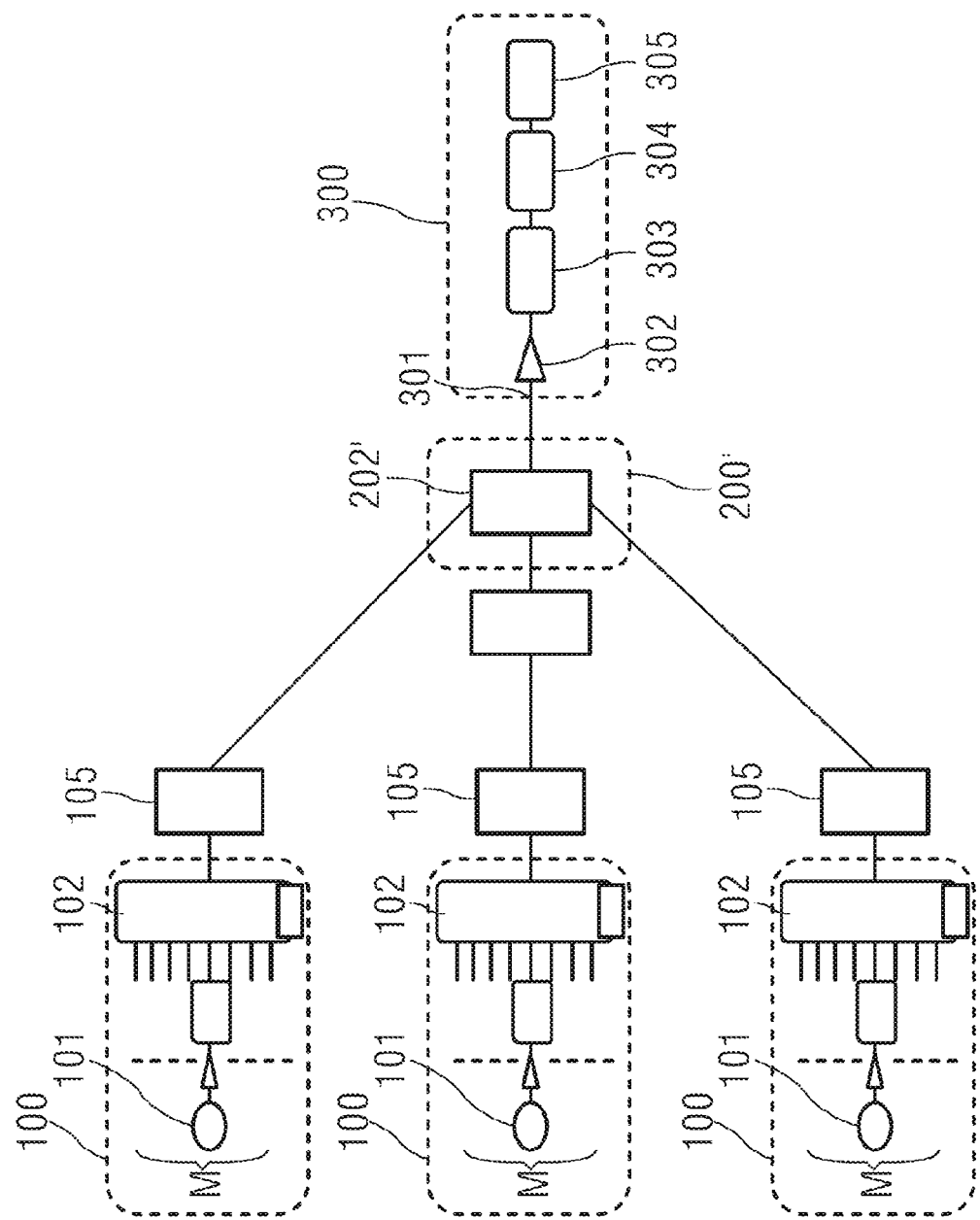
FIG. 4 is a schematic structural diagram of the magnetic resonance signal receiving apparatus in a third embodiment of the present invention.

Reference is made to FIG. 4 below, to explain a third embodiment of the present application.

This embodiment has three local coils 100 and three plugs 105. The local coils 100 are the same as in the first embodiment; each local coil 100 has multiple antenna units 101 and a time division multiplexing module 102, and each antenna unit 101 is further connected to a first amplifier 103 and a surface acoustic wave filter 104.

In addition, an RCCS 200' only has one power combiner 202'. First signals, which are detected by the three local coils 100 respectively and emitted as outputs via the time division multiplexing module 102, are provided as inputs into the power combiner 202', and the power combiner 202' subjects the three magnetic resonance input signals to power combining to form one magnetic resonance composite signal TDM Signal3, i.e. a third signal. The third signal is then provided as an input to an RF receiver 300; since only one magnetic resonance composite signal is provided as an output from the RCCS 200', the RF receiver 300 need only be equipped with one RF receiving channel 301. The magnetic resonance composite signal provided as an input to the RF receiver 300 is further provided to an analog-to-digital converter 304 via a third amplifier 302 and a compressor 303 and is converted to a digital signal, which is then processed by a digital processing unit 305. It should be noted that in this embodiment, the power combiner 202' has the same structure as in the first embodiment above.

In the embodiment above, the case where three local coils 100 are used is shown as an example, but the number of local coils is not limited to this; a different number of local coils 100, such as four local coils, could also be provided.

Fourth Embodiment

Figure 5:
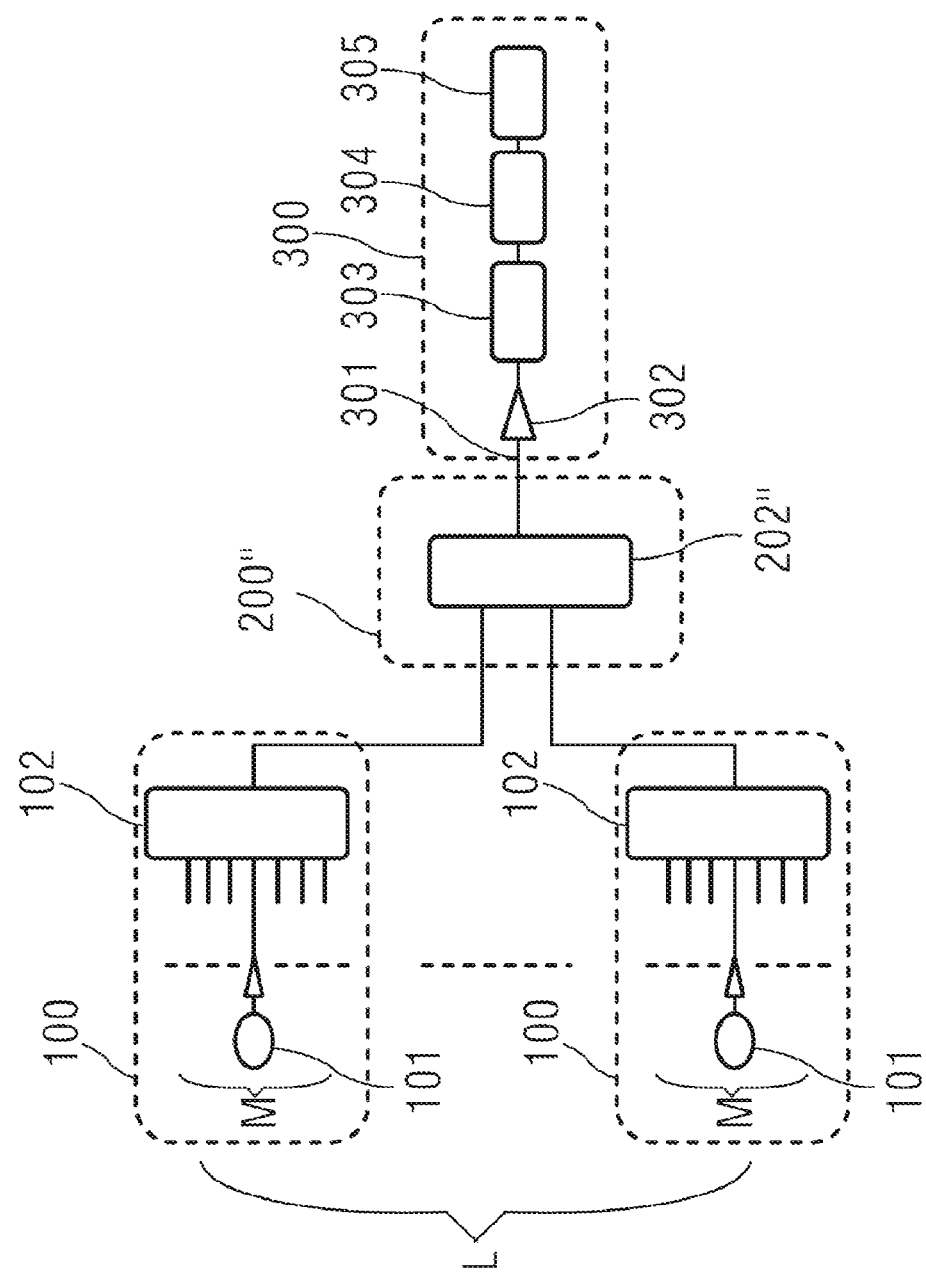
FIG. 5 is a schematic structural diagram of the magnetic resonance signal receiving apparatus in a fourth embodiment of the present invention.
Figure 6:
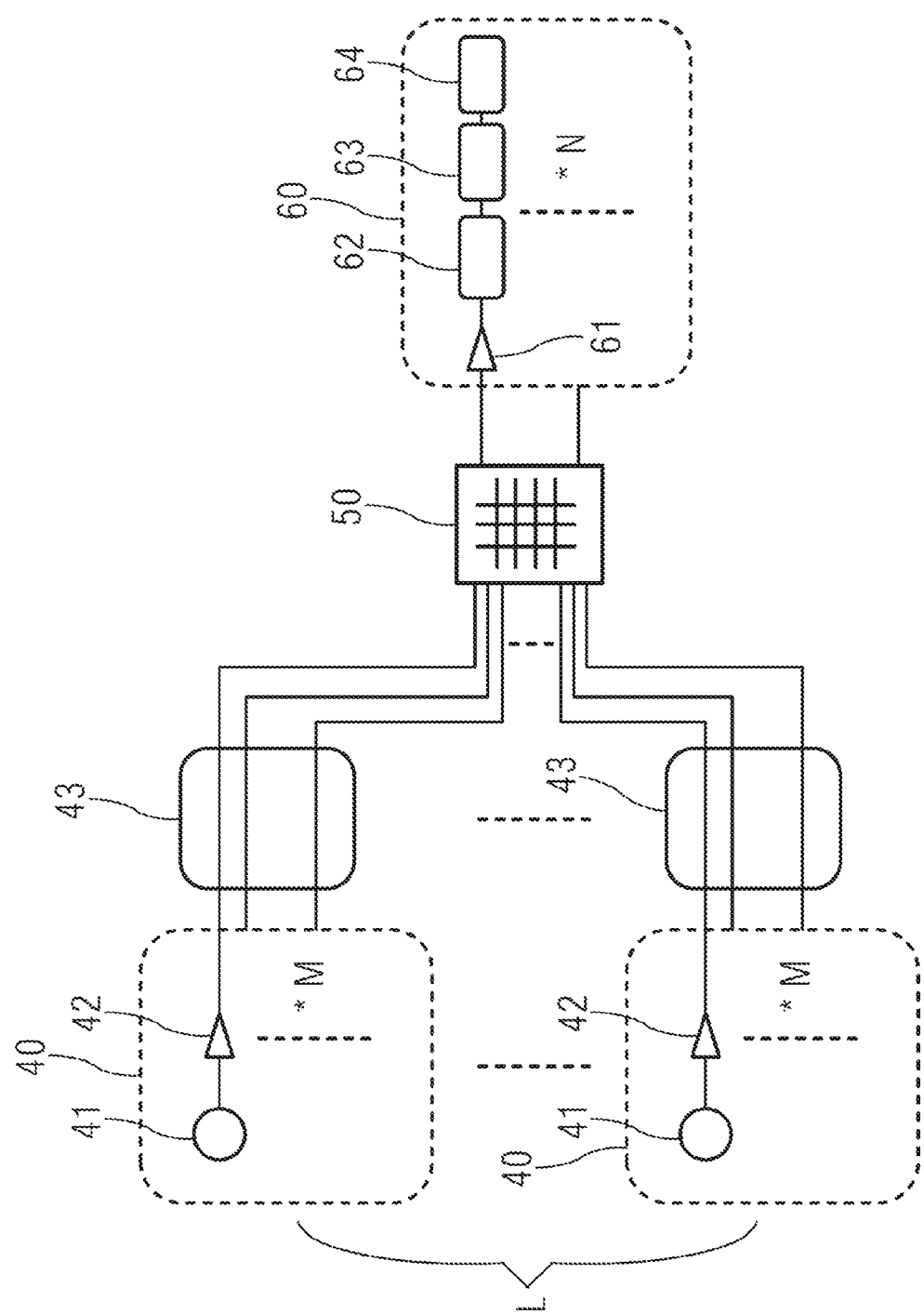
FIG. 6 is a schematic diagram of a magnetic resonance signal reception link of an existing local coil.

FIG. 5 is a diagram illustrating the structure of a fourth embodiment of the present invention. The fourth embodiment of the present application is explained below with reference to FIG. 5.

In this embodiment, local coils 100 are the same as in the first embodiment; each local coil 100 has multiple antenna units 101 and a time division multiplexing module 102, which is referred to as a first time division multiplexing module here. Each antenna unit 101 is further connected to a first amplifier 103 and a surface acoustic wave filter 104. Plugs are omitted from FIG. 5.

In this embodiment, an RCCS 200" has only a second time division multiplexing module 202", to replace the power combiner(s) in the three embodiments above. First signals, which are detected by multiple local coils 100 respectively and outputted via the time division multiplexing modules 102, are inputted into the second time division multiplexing module 202", and the second time division multiplexing module 202" combines the multiple inputted magnetic resonance signals according to different timeslots to form one magnetic resonance composite signal TDM Signal3, i.e. a third signal. The third signal is then provided as an input to an RF receiver 300. Since only one magnetic resonance composite signal is provided as an output from the RCCS 200", the RF receiver 300 need only be equipped with one RF receiving channel 301. The magnetic resonance composite signal provided as an input to the RF receiver 300 is further provided to an analog-to-digital converter 304 via a third amplifier 302 and a compressor 303 and is converted to a digital signal, which is then processed by a digital processor 305.

Thus, instead of using a power combiner to power-combine magnetic resonance signals from different antenna units 101 to form one magnetic resonance composite signal as in the embodiments above, in this embodiment the second time division multiplexing module 202" is used to combine magnetic resonance signals from different antenna units 101 in time, to form one magnetic resonance composite signal.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance signal receiving apparatus, comprising:
   multiple local coils, each designed to separately receive magnetic resonance signals originating from a subject undergoing a magnetic resonance examination, each local coil comprising multiple antenna units and a time division multiplexing module, said time division multiplexing module being configured to cause magnetic resonance signals, received by the respective antenna units and provided to the time division multiplexing module, to be emitted as an output from the time division multiplexing module via a single output line of the time division multiplexing module;
   a reception coil channel selector configured to operate the time division multiplexing module to select which magnetic resonance signals, from respective local coils among said multiple coils, are individually provided as outputs via said single output line; and
   a combiner circuit connected to the single output line of each of said multiple local coils, said combiner circuit being configured to combine, in time or power, all or a portion of the magnetic resonance signals provided to said combiner circuit by the respective single output lines of the local coils in order to form at least one magnetic resonance composite signal therefrom,
   wherein said combiner circuit is a power combiner comprising a plurality of amplification resistance circuits connected in parallel, each amplification resistance circuit comprising an amplifier and a first resistor, with the parallel-connected amplification resistance circuits being connected in series with a second resistor.

2. A magnetic resonance signal receiving apparatus as claimed in claim 1 comprising, between each of the multiple antenna units and the time division multiplexing module, an amplifier and a bandpass filter connected in series.

3. A magnetic resonance signal receiving apparatus as claimed in claim 1 wherein said combiner circuit is a further time division multiplexing module.

4. A magnetic resonance signal receiving apparatus as claimed in claim 1 comprising a radio-frequency receiver comprising at least one radio-frequency receiving channel connected to the output of said reception coil channel selector, and
   wherein said at least one magnetic resonance composite signal formed by said combiner circuit is supplied to said radio-frequency receiver via the radio-frequency receiving channel.

5. A magnetic resonance signal receiving apparatus as claimed in claim 1 comprising a switch array in said reception coil channel selector, said switch array being configured to selectively pass a number of magnetic resonance signals from said local coils and to provide a past portion of magnetic resonance signals as an input to said combiner circuit.

6. A magnetic resonance signal receiving apparatus as claimed in claim 1 wherein said time division multiplexing module comprises a programmable logic device that controls a time slot in which respective magnetic resonance signals from the respective antenna units are inserted in order to be provided as an output from the time division multiplexing module.

7. A magnetic resonance signal receiving apparatus as claimed in claim 1 comprising a plurality of combiner circuits and a switch array that selects respective outputs from the plurality of combiner circuits as a group in order to form the at least one composite magnetic resonance signal.

8. A magnetic resonance signal receiving apparatus as claimed in claim 1 comprising a radio-frequency receiver comprising at least one radio-frequency receiving channel connected to the output of said reception coil channel selector, wherein said at least one magnetic resonance composite signal formed by said combiner circuit is supplied to said radio-frequency receiver via the radio-frequency receiving channel, and wherein a number of said radio-frequency receiving channels is equal to a number of magnetic resonance composite signals formed by combination in said combiner circuit.

9. A reception channel circuit for use with multiple local coils, each designed to separately receive magnetic resonance signals originating from a subject undergoing a magnetic resonance examination, each local coil comprising multiple antenna units and a time division multiplexing module, said time division multiplexing module being configured to cause magnetic resonance signals, received by the respective antenna units and provided to the time division multiplexing module, to be emitted as an output from the time division multiplexing module via a single output line of the time division multiplexing module, said reception channel circuit comprising:

a reception coil channel selector configured to operate the time division multiplexing module to select which magnetic resonance signals, from respective local coils among said multiple coils, are individually provided as outputs via said single output line; and a combiner circuit connected to the single output line of each of said multiple local coils, said combiner circuit being configured to combine, in time or power, all or a portion of the magnetic resonance signals provided to said combiner circuit by the respective single output lines of the local coils in order to form at least one magnetic resonance composite signal therefrom, wherein said combiner circuit is a power combiner comprising a plurality of amplification resistance circuits connected in parallel, each amplification resistance circuit comprising an amplifier and a first resistor, with the parallel-connected amplification resistance circuits being connected in series with a second resistor.

10. A magnetic resonance apparatus comprising:

a magnetic resonance data acquisition scanner comprising a plurality of local coils that each separately receive magnetic resonance signals from a body undergoing a magnetic resonance examination;

each local coil comprising multiple antenna units and a time division multiplexing module, said time division multiplexing module being configured to cause magnetic resonance signals, received by the respective antenna units and provided to the time division multiplexing module, to be emitted as an output from the time division multiplexing module via a single output line of the time division multiplexing module;

a reception coil channel selector configured to operate the time division multiplexing module to select which magnetic resonance signals, from respective local coils among said multiple coils, are individually provided as outputs via said single output line; and a combiner circuit connected to the single output line of each of said multiple local coils, said combiner circuit being configured to combine, in time or power, all or a portion of the magnetic resonance signals provided to said combiner circuit by the respective single output lines of the local coils in order to form at least one magnetic resonance composite signal therefrom, wherein said combiner circuit is a power combiner comprising a plurality of amplification resistance circuits connected in parallel, each amplification resistance circuit comprising an amplifier and a first resistor, with the parallel-connected amplification resistance circuits being connected in series with a second resistor.

* * * * *